(12) United States Patent
Godavarthi et al.

(10) Patent No.: US 9,704,598 B2
(45) Date of Patent: Jul. 11, 2017

(54) USE OF IN-FIELD PROGRAMMABLE FUSES IN THE PCH DYE

(71) Applicant: INTEL CORPORATION, Santa Clara, CA (US)

(72) Inventors: Vinupama Godavarthi, Folsom, CA (US); Mukesh Kataria, Santa Clara, CA (US)

(73) Assignee: INTEL CORPORATION, Santa Clara, CA (US)

( * ) Notice: Subject to any disclaimer, the term of this patent is extended or adjusted under 35 U.S.C. 154(b) by 111 days.

(21) Appl. No.: 14/583,608

(22) Filed: Dec. 27, 2014

(65) Prior Publication Data

US 2016/0189793 A1   Jun. 30, 2016

(51) Int. Cl.
G06F 17/50 (2006.01)
G11C 17/18 (2006.01)
G11C 17/16 (2006.01)
G06F 11/30 (2006.01)
G11C 7/10 (2006.01)

(52) U.S. Cl.
CPC .......... *G11C 17/18* (2013.01); *G06F 11/3024* (2013.01); *G06F 11/3058* (2013.01); *G11C 17/16* (2013.01); *G11C 7/1006* (2013.01)

(58) Field of Classification Search
CPC ........................ G06F 11/1068; G06F 17/5054
USPC .......................................................... 716/116
See application file for complete search history.

(56) References Cited

U.S. PATENT DOCUMENTS

| | | |
|---|---|---|
| 3,246,242 A | 4/1966 | O'Hagan et al. |
| 5,844,917 A | 12/1998 | Salem et al. |
| 5,867,809 A | 2/1999 | Soga et al. |
| 6,134,675 A | 10/2000 | Raina |
| 6,908,227 B2 | 6/2005 | Rusu et al. |
| 7,146,292 B2 | 12/2006 | Rossi et al. |
| 7,183,799 B1 | 2/2007 | Donlin et al. |
| 7,313,706 B2 | 12/2007 | Williams et al. |

(Continued)

FOREIGN PATENT DOCUMENTS

| | | |
|---|---|---|
| DE | 10238174 | 3/2004 |
| DE | 102004012056 | 2/2005 |

(Continued)

OTHER PUBLICATIONS

Notice of Allowance for U.S. Appl. No. 13/221,152, mailed Apr. 1, 2015.

(Continued)

*Primary Examiner* — Suchin Parihar
(74) *Attorney, Agent, or Firm* — Jason H. Vick; Sheridan Ross, PC

(57) ABSTRACT

A processor has a limited set of guard bands that the processor uses, and when a certain amount of stress is accumulated as indicated by the cumulative stress counters ($S_{eff}$), and the threshold for the current guard is about to be exceeded, the processor switches to the next wider guard band with this technique occurring until all the guard bands are used and end of life settings are reached. This data that can be stored in the FPFs, and in accordance with one exemplary embodiment, the guard band index itself is also stored in the FPFs and used to ensure the most accurate guard band is used by the processor/device.

20 Claims, 10 Drawing Sheets

(56) References Cited

U.S. PATENT DOCUMENTS

| | | | |
|---|---|---|---|
| 7,412,353 B2 | 8/2008 | Borkar et al. | |
| 7,472,038 B2 | 12/2008 | Bose et al. | |
| 7,482,269 B2 | 1/2009 | Suzuki | |
| 7,493,477 B2 | 2/2009 | Velhal et al. | |
| 7,495,519 B2 | 2/2009 | Kim et al. | |
| 7,574,613 B2 | 8/2009 | Holle et al. | |
| 7,616,021 B2 | 11/2009 | Papageorgiou et al. | |
| 7,774,590 B2 | 8/2010 | Borkar et al. | |
| 7,774,625 B1 | 8/2010 | Sheng et al. | |
| 7,779,287 B2 | 8/2010 | Lim et al. | |
| 7,849,332 B1 | 12/2010 | Alben et al. | |
| 7,917,328 B2 | 3/2011 | Casey et al. | |
| 8,064,197 B2 | 11/2011 | Mowry et al. | |
| 8,151,094 B2 | 4/2012 | Vera | |
| 2001/0021217 A1 | 9/2001 | Genther et al. | |
| 2003/0005380 A1 | 1/2003 | Nguyen et al. | |
| 2003/0078741 A1 | 4/2003 | Storino | |
| 2003/0110012 A1 | 6/2003 | Orenstien et al. | |
| 2004/0123201 A1 | 6/2004 | Nguyen et al. | |
| 2005/0022185 A1 | 1/2005 | Romero | |
| 2005/0125181 A1 | 6/2005 | Norman et al. | |
| 2005/0144524 A1 | 6/2005 | Bonaccio et al. | |
| 2005/0237319 A1 | 10/2005 | Ranganathan et al. | |
| 2005/0240850 A1 | 10/2005 | Ohwada et al. | |
| 2006/0015674 A1 | 1/2006 | Murotake | |
| 2006/0015862 A1 | 1/2006 | Odom et al. | |
| 2006/0114024 A1 | 6/2006 | Feng et al. | |
| 2006/0171244 A1 | 8/2006 | Ando | |
| 2006/0212269 A1 | 9/2006 | Lee et al. | |
| 2006/0259840 A1* | 11/2006 | Abadeer et al. | 714/733 |
| 2007/0033425 A1 | 2/2007 | Clark | |
| 2007/0064805 A1* | 3/2007 | Carrig et al. | 375/240.16 |
| 2007/0297254 A1* | 12/2007 | Rosal et al. | 365/201 |
| 2008/0126748 A1 | 5/2008 | Capps et al. | |
| 2010/0134167 A1* | 6/2010 | Papageorgiou et al. | 327/175 |
| 2010/0214007 A1 | 8/2010 | Konstadinidis et al. | |
| 2010/0268931 A1 | 10/2010 | Borkar et al. | |
| 2011/0101990 A1* | 5/2011 | Noorlag et al. | 324/537 |
| 2011/0102064 A1* | 5/2011 | Noorlag et al. | 327/524 |
| 2011/0260318 A1* | 10/2011 | Eisenstadt | 257/737 |
| 2012/0218034 A1* | 8/2012 | Turullols et al. | 327/540 |
| 2013/0021851 A1* | 1/2013 | Chang et al. | 365/189.05 |
| 2013/0021854 A1* | 1/2013 | Huang | 365/189.07 |
| 2013/0039139 A1* | 2/2013 | Raval et al. | 365/201 |
| 2013/0054179 A1 | 2/2013 | Shapira et al. | |
| 2014/0022008 A1* | 1/2014 | Noorlag et al. | 327/540 |
| 2014/0145240 A1* | 5/2014 | Harrington, III | 257/139 |
| 2015/0109052 A1* | 4/2015 | Gowda et al. | 327/544 |
| 2015/0253808 A1* | 9/2015 | Chadwick et al. | 365/201 |

FOREIGN PATENT DOCUMENTS

| | | |
|---|---|---|
| DE | 10357284 | 7/2005 |
| WO | WO 00/65363 | 11/2000 |
| WO | WO 2004/012131 | 2/2004 |
| WO | WO 2005/029329 | 3/2005 |
| WO | WO 2006/004875 | 1/2006 |
| WO | WO 2013/032705 | 3/2013 |

OTHER PUBLICATIONS http://en.wikipedia.org/wiki/platform_controller_hub; Printed Feb. 26, 2015.

International Search Report for corresponding International Application No. PCT/US2012/050895, mailed Mar. 19, 2013.

Written Opinion for corresponding International Application No. PCT/US2012/050895, mailed Mar. 19, 2013.

International Preliminary Report on Patentability for corresponding International Application No. PCT/US2012/050895, mailed Mar. 13, 2014.

Office Action for U.S. Appl. No. 13/221,152, mailed Sep. 25, 2014.

Office Action for U.S. Appl. No. 13/221,152, mailed Jan. 15, 2015.

* cited by examiner

USE OF IN-FIELD PROGRAMMABLE FUSES IN THE PCH DYE

TECHNICAL FIELD

An exemplary aspect relates to processors. In particular, exemplary embodiments relate to processors and memory as well as methods and techniques use of in-field programmable fuses. Even more specifically, embodiments relate to the use of in-field programmable fuses to store reliability odometer information.

BACKGROUND

Processors are commonly operable to perform instructions to access memory and perform computations. For example, processors may execute load instructions to load or read data from memory and/or store instructions to store or write data to memory, to facilitate various computational processes, and the like. Additionally, processors execute one or more applications to, for example, solve problems, analyse data, perform computations, and the like. All these as well as environmental factors age a processor.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DESCRIPTION OF EMBODIMENTS

Figure 1:
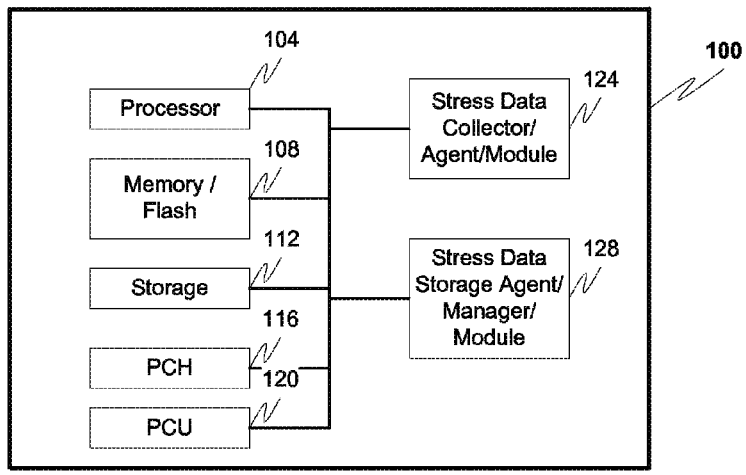
FIG. 1 illustrates an exemplary computing device.

In modern processors and other semiconductor devices, it is known that as the device ages, certain degradations become manifest. Several different phenomena can cause degradation and stress to a semiconductor device, for example, hot-carrier injection, bias temperature instability, oxide breakdown, time dependent dielectric breakdown, electro-migration, and the like. Each of these degradation mechanisms can occur due to various fluctuations in factors such as temperature, voltage, current, and the like.

For example, a frequency degradation can occurs over a product's lifetime due to negative bias temperature instability degradation. This degradation becomes a reliability issue for P-channel metal oxide semiconductors and N-channel metal oxide semiconductor transistors. Negative bias temperature instability manifests itself as an increase in the threshold voltage and consequent decrease in drain current and transconductance. The degradation can be caused by temperature and voltage applied to the product over time, where the temperature and voltage impact degradation exponentially.

One manner of handling these degradations is by applying a voltage/frequency guard band at a product's beginning of life, when the product is new. However, this guard band limits performance for much of the useful life of the device. For example, maximum frequency ($F_{Max}$) and minimum voltage ($V_{Min}$) settings at a beginning of life, when the product is new, are set assuming end of life degradation when the product has aged. As a result, there is a speed guard band where the frequency is set lower than a maximum rate of frequency of the unit at a fixed voltage and/or a voltage is set higher than a minimum rated voltage of the unit at a fixed frequency.

This effective stress on a processor or other semiconductor device can be determined and used to control frequency/voltage or other settings at which the device operates. In this manner, when there is low stress, for example when the product is relatively new, the product can operate at a higher frequencies and/or lower voltages. As a result, it is possible for a processor to gain multiple frequency bins, e.g., one or two turbo frequency bins at the beginning of its lifetime. Moreover, since power is a square function of voltage, the processor may be able to run at a lower power to realize the same performance.

To determine effective stress on the processor, a stress detector may be provided. The stress detector can be implemented with a "reliability odometer." The reliability odometer may be used to track the temperature and voltage or other stress generating factors that the processor undergoes and experiences. As one example, the reliability odometer can be implemented in logic of a power control unit (PCU) or other controller or subsystem of the processor. With this tracked information, the reliability odometer can calculate an effective reliability stress that causes the degradation. The effective stresses can be accumulated from a first powering on of the processor, and updated on every boot thereafter. When the processor is new, at the beginning of its lifetime, the processor can work with better performance and power efficiency, and without suffering from guard bands unnecessarily protecting it against aging.

To maintain information regarding the effective stresses, a non-volatile storage can be used to accumulate the effective stress information NO over multiple boot and shut down cycles. A peripheral control hub (PCH), further details of which can be found on Wikipedia at en.wikipedia.org/wiki/platform_controller_hub, may provide this non-volatile storage. The processor can read and write data to the PCH using, for example, a vendor defined message structure. During processor operation, and as the product ages due to the applied stresses discussed herein, the voltage and frequency settings of the processor can be dynamically updated, and in a similar manner, the voltage and frequency settings of one or more of the graphics subsystem, memory, or any other subsystem or component updated any similar manner. The PCU logic can perform the stress calculations and trigger any appropriate changes in the product settings over time.

This PCU logic may be coupled to receive temperature and voltage inputs, and upon a change, the effective stress can be calculated as an over-time integral of $S_{eff}$, which is a function of voltage, temperature, current and/or any other stress factor. From this information, an effective stress can be determined based on the physical functions that describe the stress's impact on degradation. For example, negative bias temperature instability stress is an exponential function of voltage and temperature, and the effective stress is an integral of the accumulated stress over time. Although the embodiments discussed herein are not limited in this regard, every time the temperature or voltage of the processor changes, the effective stress can be re-calculated and reconciled with the value corresponding to the previously accumulated stress. When the value of this effective stress, which can be stored in a register or a comparable storage device, counter, or other storage, reaches a predefined threshold, the logic may implement a change in the voltage/frequency setting of the product. For example, a higher voltage may be provided to sustain the same frequency, or the processor may run at a lower frequency for a given voltage.

To provide for communications between the PCU and the PCH, typically an interconnect and complementary logic performs this function. Fuses and registers can also be used on the processor to update settings, and can use a manageability engine to manage updates and reads to a non-volatile memory that stores the effective stress information. As one example, the non-volatile memory that stores the effective stress information can be in a flash memory of the PCH. The device can also include a non-volatile storage to store the accumulated stress value information.

As discussed, processor guard band reduction is a feature in which the CPU adjusts the guard band ($F_{Max}/V_{Min}$) based on processor aging and wear by accumulating effective stresses over time, and dynamically adjusting the guard bands used. This guard band reduction is also known as a reliability odometer or stress counter where one or more of frequency and voltage are adjusted based on usage and time. This guard band is adjusted as opposed to using a single wide enough guard band to cover end of life degradation which would be set at the time of manufacturing. This feature involves collecting several d-words worth of stress data as counters, storing, and periodically updating this stress data in non-volatile storage for persistence and then retrieving it on every boot to set the guard band based on the aging of the device.

There are two main components involved in implementing this feature, one is the agent that is responsible for collecting the actual stress data and the second is the agent that is responsible for managing the persistent storage where the stress data is stored/retrieved. One problem is that the non-volatile storage that is intended for this feature, i.e., the external flash/boot device is subject to the following scenarios:

1. The device can be re-programmed in the OEM/DM factory for platform repair or refurbishment, e.g., re-provisioning, 2. A backup of the contents of the storage is created and is used at a later time to replace the existing content of the storage due to one or more of corruption or other reason, such as rollback, and 3. The processor package and storage paring can be broken, and the package moved to a different platform, e.g., package replacement, with the information in storage being lost.

With all of the above scenarios, the accumulated stress data is lost and therefore the guard band information for the device is no longer accurate. The loss of this guard band information will make the device, e.g., the processor, appear much newer, or older, depending on what type of incorrect guard band information is used. This in turn has in impact on performance.

The difficulties associated with the above scenarios can be addressed if a form of non-volatile storage, e.g., phase-change memory, exists within the package itself.

In-field programmable fuses (FPFs) is a technology that's integrated in the processor package that offers field programmable fuses as storage for very limited amounts of data. In accordance with one exemplary embodiment, a technique is described to allocate a number of bits in FPFs and used the FPFs as an auxiliary storage where each bit in the allocated FPF can indicate a certain threshold (e.g., guard band) reached by the processor. When a certain threshold is reached in the stress counters, the agent collecting the stress data indicates that an increment to the value of the stress counter held in the FPF needs to occur. Additionally, when any of the scenarios mentioned above are detected by the agent managing data in the external storage, the agent can cause an increment to the value held in the FPF. This step can account for any loss in stress data when any of the above mentioned scenarios occur and before the next roll-over to the next level is flagged by the stress collector. As such, both the non-volatile storage and FPFs can be used to ensure the guard band for the processor is always accurate, even if one or more of the three above scenarios occur.

In accordance with one exemplary embodiment, the processor has a limited set of guard bands that the processor uses, and when a certain amount of stress is accumulated as indicated by the cumulative stress counters ($S_{eff}$), and the threshold for the current guard is about to be exceeded, the processor switches to the next wider guard band with this technique occurring until all the guard bands are used and end of life settings are reached. The data that can be stored in the FPFs, in accordance with one exemplary embodiment, is the guard band index itself.

FIG. 1 illustrates an exemplary computing architecture 100. The computing architectural 100 includes a processor(s) 104, memory 108, storage 112, a PCH 116, a PCU 120, a stress data collector agent or module 124 and a stress data storage agent, manager or module 128. In addition, well known componentry can be included in the computer architecture 100, however the well know componentry has been omitted for clarity.

Figure 2:
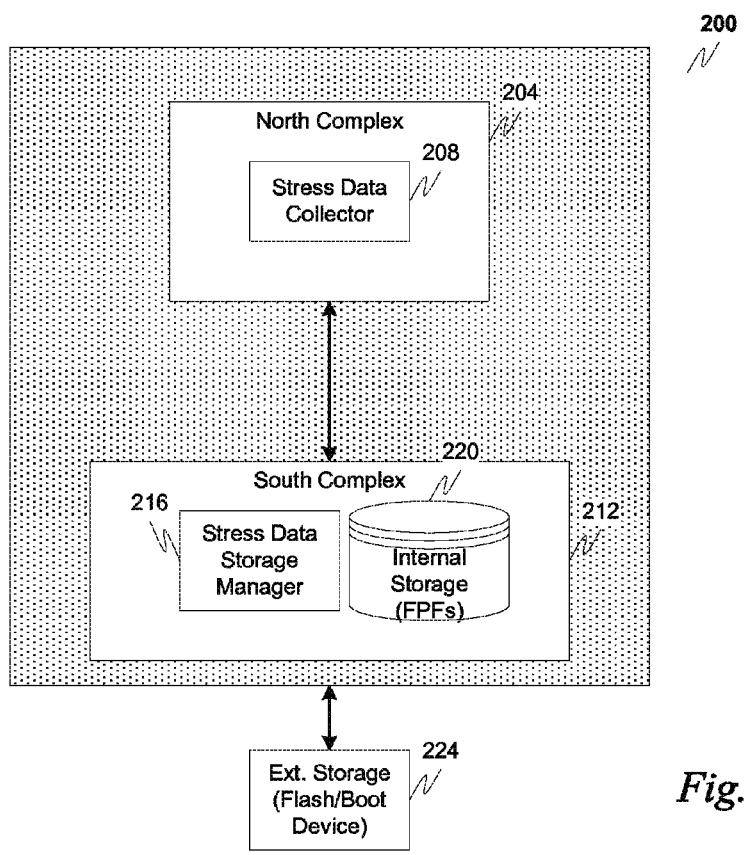
FIG. 2 illustrates an exemplary high-level processor architecture.

FIG. 2 outlines in greater detail a processor architecture 200. In particular, the processor architecture 200 includes a north complex 204, with a stress data collector 208 (similar to the stress data collector 124) and a south complex 212, with a stress data storage manager 216 (similar to stress data storage gent 128) and internal storage (FPFs) 220. The processor architecture 200 can be in communication with one or more external storage devices 224, such as a flash storage or a boot device storage.

Operation of the exemplary techniques discussed herein will be discussed in relation to the generic componentry illustrated in FIG. 1 and/or the more specific componentry illustrated in FIG. 2 where similar components perform similar functions. While the techniques disclosed herein will be specifically detailed in relation to a processor having a north and a south complex, it is to be appreciated that the techniques are more generally applicable to any type of computing device, processor, architecture and/or equipment that utilizes a guard band(s).

Figure 3:
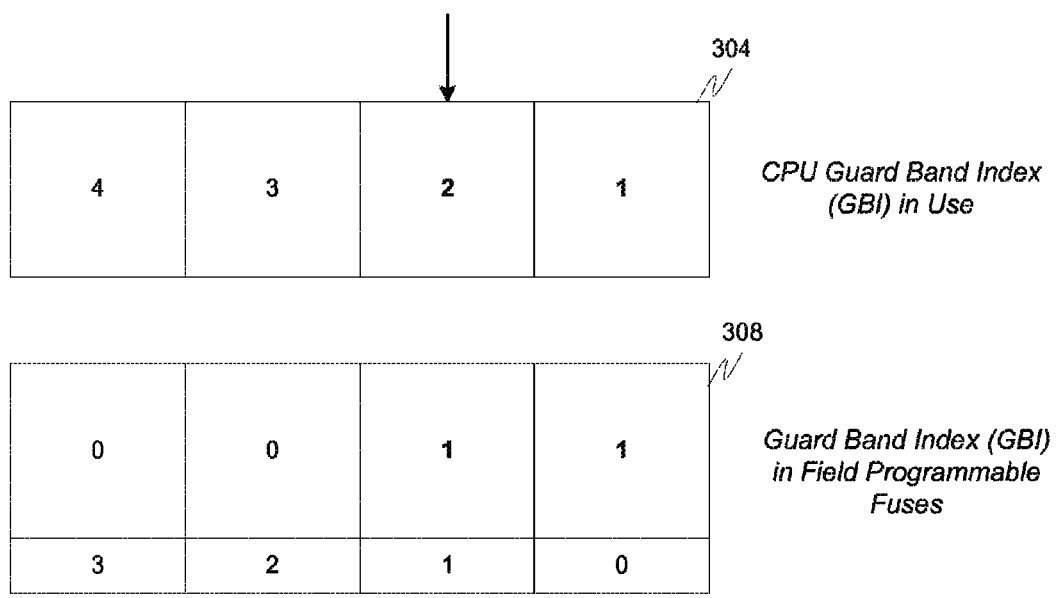
FIG. 3 illustrates an exemplary guard band index mapping.

As illustrated in FIG. 2, the internal storage (FPFs) 220 can provide the auxiliary storage that tracks the guard band index currently in use, with this value capable of being updated as the stress data accumulates. As shown in FIG. 3, an example of the guard band index mapping within the internal storage 220 is shown when guard band index "2" is in use in the processor. Here, and when guard band index 304 (GBI) 2 is in use in the CPU, the guard band index (GBI) 308 within the field programmable fuses 308 is shown. The CPU Guard Band is divided into n bands (e.g., n=5) with each band corresponding to a threshold value defined and managed by the processor stress collector. When the threshold for the current band is reached the processor steps down to the next guard band. The details of the band and their threshold values can optionally be contained within the scope of the stress collector only.

In accordance with one exemplary operational embodiment, the stress data storage manager 216 detects one or more of the following conditions to determine whether the $S_{eff}$ is valid: 1) re-provision, 2) roll-back, and 3) replacement of the package. If the stress data storage manager 216 determines that the $S_{eff}$ is valid, and none of the above conditions have occurred, the stress data storage manager 216 retrieves from one or more of the internal storage 220 and the external storage 224 the information regarding the current guard band index which is forwarded to the stress data collector, and the GBI applied to the processor/CPU.

However, if any of the above conditions do exists, which reflects that the $S_{eff}$ is not accurate, in one exemplary embodiment the guard band index in the internal storage 220 is incremented in the FPF and the $S_{eff}$ in the external storage is reset to this new incremented value. This incremented guard band index is then sent to the stress data collector 208 to be used as the basis for future GBI determinations. When the conditions mentioned occur, that means the data in the flash storage is lost or stale. Thus, the system must rely on the auxiliary data in the FPF's—which is at a coarser granularity than the data in the flash storage and is updated only when a guard band threshold is reached. Hence when the condition occurs, the system does not know progress in current guard band. The guard band could be at the front, middle or tail of the current guard band; the system simply does not know. To account for the possibility of being in the tail end, in one optional embodiment, the increment is performed however this is not required.

Upon receipt, the stress data collector 208 synchronizes the guard band index to the received stress data ($S_{eff}$). If the $S_{eff}$ is equal to zero, and the guard band index is equal to one, the stress data collector 208 uses the current data. If the $S_{eff}$ is equal to zero, and the guard band index is greater than one, the $S_{eff}$ is updated to match the current guard band index. Otherwise, the guard band index is calculated to match the $S_{eff}$. This updated information is then returned to the stress data storage manager 216 such that the updated $S_{eff}$ can be stored in the external storage 224. If the internal guard band index is not equal to the guard band index received, the guard band index is incremented in the internal storage 220 as well. The system then continues using the stored guard band index until a next update cycle is required.

Operation of a run-time flow will be discussed in relation to when a certain threshold has been reached, and the data regarding the guard band index is stored in the internal storage 220. Here, the stress data collector 208 reads the stress data and the guard band such that the guard band is updated when a certain threshold of stress data is received. This received stress data can then be sent the stress data storage manager 216 with the stress data storage manager 216 determining whether an update to the guard band index is required. If an update is required, the guard band index is incremented and the new value stored in the internal storage 220. Similarly, the stress data storage manager 216 can update the guard band index information in the external storage 224 using, for example, the guard band index similar to that as shown in FIG. 3.

In accordance with another exemplary embodiment, the stress data storage manager 216 begins operation by preparing the $S_{eff}$ by looking at the stress data in an external memory such as a flash memory, the stress data in the FPF and whether or not a rollback or re-provision has been detected. Based on this information, the $S_{eff}$ information is forwarded to the stress data collector 208. The stress data collector 208 checks for a miss-match between the in-use guard band index and the information received from the stress data storage manager 216. This miss-match can be a result of, for example, a rollback, or a re-provision, or because the stress data in the FPF 220 and the external storage 224 do not match. If there is a miss-match, the stress data collector 208 can reevaluate what the current guard band should be, and send an updated $S_{eff}$ to the stress data storage manager 216 which can then update one or more of the internal storage 220 and an external storage 224.

Figure 4:
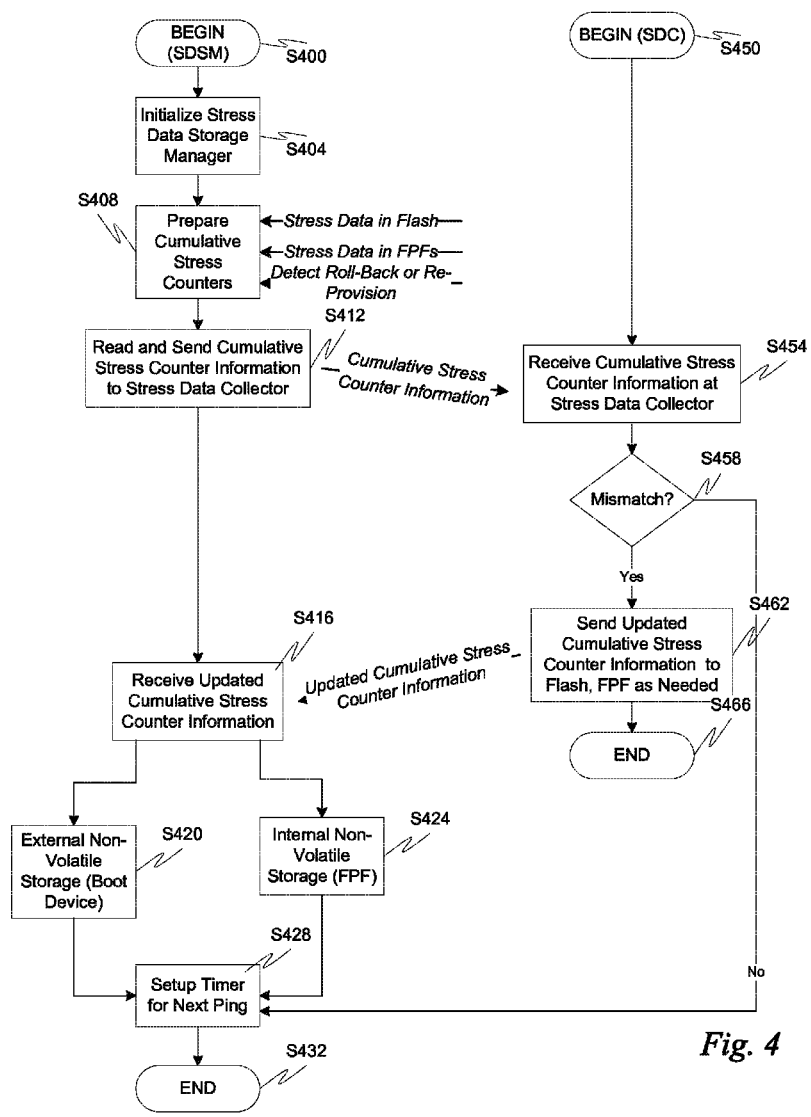
FIG. 4 is a flowchart outlining an exemplary method of operation upon a startup of the device.

FIG. 4 illustrates an exemplary method for checking the guard band index upon every boot-up (soft or hard boot). For example, in the stress data storage manager (SDSM), control begins in step S400. Control begins for the stress data collector (SDC) in step S450.

In Step S404, the stress data storage manager is initialized. Next, in step S248, the cumulative stress counters are initialized with reference to one or more data of: stress data in external storage, such as flash storage, stress data in the internal storage, such as in FPF's, and information regarding whether or not a roll-back or re-provision has occurred. Then, in step S412, the cumulative stress counter information is packaged for sending to the stress data collector in a message.

The stress data collector in step S454 receives the cumulative stress counter information and determines, in step S458, whether there is a miss-match between the received cumulative stress counter information and the guard band currently in use. If there is not a miss-match, control jumps to step S428 with control otherwise continuing to step S462. In step S462, updated cumulative stress counter information is determined and forwarded in a message to the stress data storage manager with control continuing to step S466 where the control sequence ends.

In step S416, the updated cumulative stress counter information is received at the stress data storage manager, and in step S420, the updated cumulative stress counter information stored in the external non-volatile storage and/or, in step S424, also stored in the internal non-volatile storage, such as in FPFs. Control then continues to step S428.

In step S428, the timer is reset for the next "ping" or other event such as a hard or soft boot that requires re-evaluation and confirmation that the guard band is correct. Control then continues to step S432 where the control sequence ends.

Figure 5:
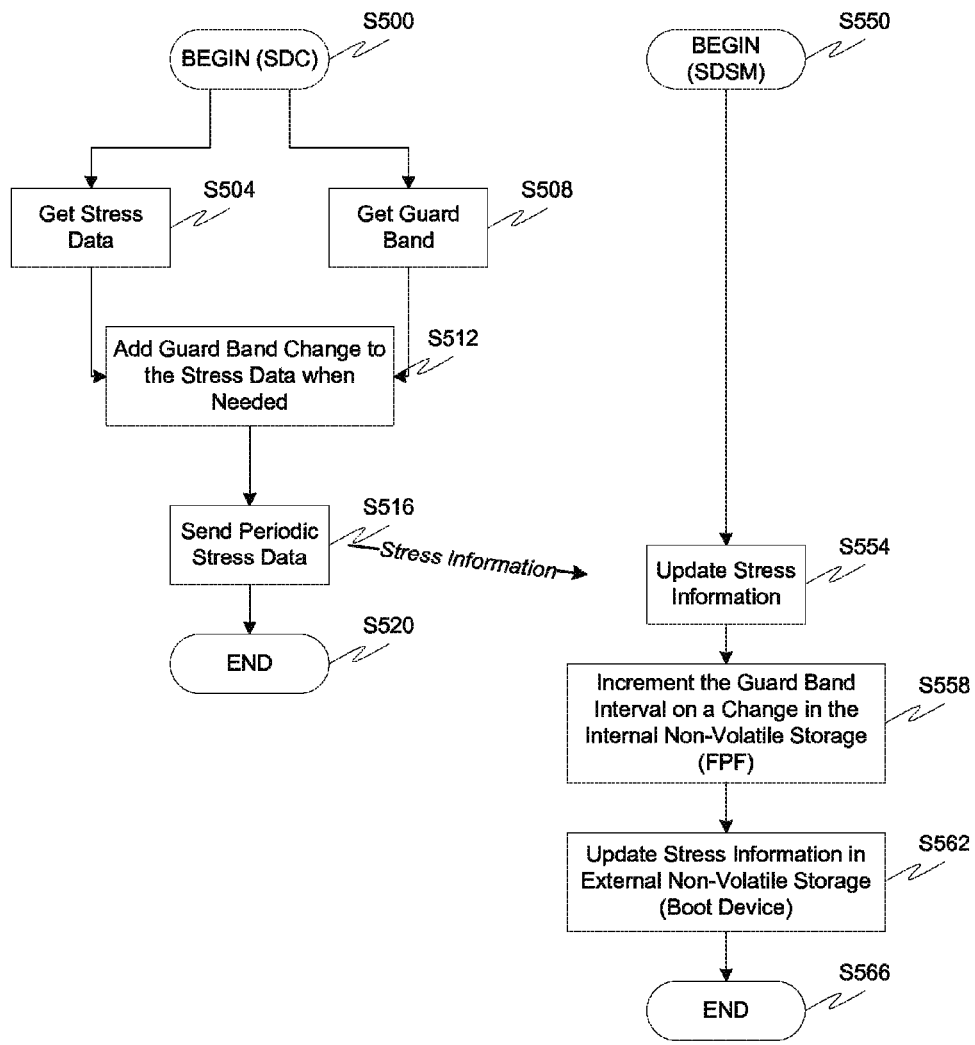
FIG. 5 is a flowchart illustrating an exemplary method for storing updated guard band index information when a threshold is reached.

FIG. 5 outlines an exemplary method for run time flow of a processor when a guard band threshold has been reached, and the updated guard band information needs to be stored in the internal storage. In particular, control for the stress data collector begins in step S500 and continues to step S504 and step S508. In step S504, the stress data is obtained, and in step S508, information regarding the current guard band in use is read. Then, in step S512, a change in the guard band is registered based on the stress data, when needed, such as when the stress data exceeds one or more predetermined thresholds. Control then continues to step S516.

In step S516, the stress data can be periodically sent to the stress data storage manager. Control then continues to step S520 where the control sequence ends.

For the stress data storage manager, control begins in step S550 and continues to step S554. In step S554 the stress information is received from the stress data collector with that stress data being stored. Next, in step S558 and based on a change in the stress information, the guard band index can be incremented with this incremented value stored in the internal storage, such as in a FPF. Control then continues to step S562 where the stress information is updated in the external non-volatile storage. Control then continues to step S566 where the control sequence ends.

Figure 6:
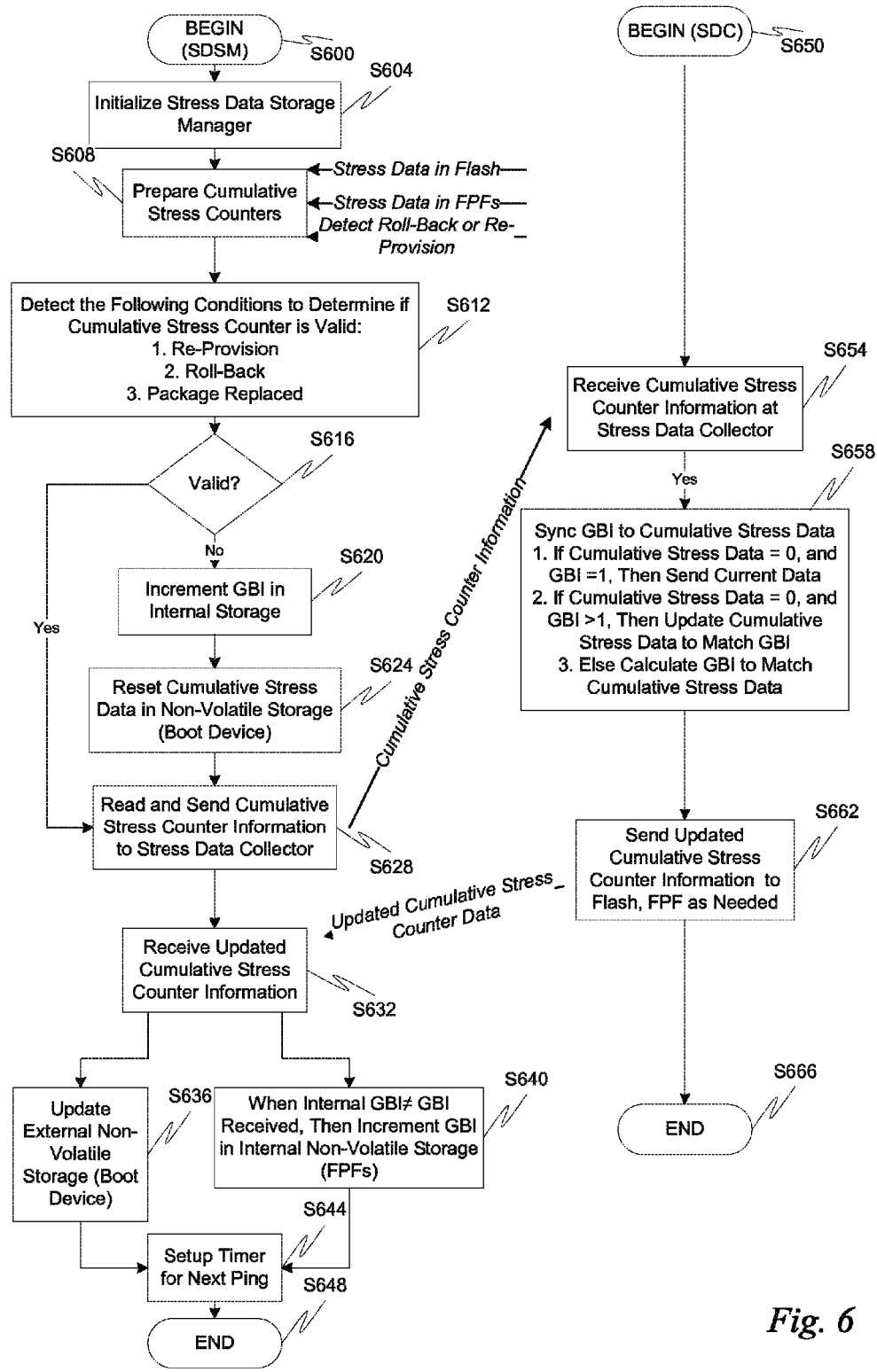
FIG. 6 is a flowchart outlining an exemplary method for updating guard band index information in non-volatile storage.

FIG. 6 outlines another exemplary method for updating and storing stress and/or guard band information. In particular, and for the stress data storage manager, control begins in step S600. For the stress data collector, control begins in step S650.

In the stress data storage manager, in step S604, the stress data storage manager is initialized. Next, in step S608, the cumulative stress counters are prepared based on information from one or more of data in external storage, such as flash storage, stress data from internal storage, such as in the FPFs, and information regarding whether a roll back or re-provision has occurred. Next, in step S612, certain conditions are evaluated to make a determination whether the cumulative stress counter information is valid: 1. re-provision, 2. rollback, and 3. package replacement.

If the cumulative stress counter is valid, in step S616 control jumps down to step S628 with control otherwise continuing to step S620. In step S620, the guard band index in the internal storage is incremented. Next, in step S624, the cumulative stress data in the non-volatile storage is reset based on this incremented guard band index value. Then, in step S628, the cumulative stress counter information is read and sent to the stress data corrector.

The stress data collector, in step S654, receives the cumulative stress counter information. Next, in step S658, the guard band index is synced to the cumulative stress data based on the following conditions:

If Cumulative Stress Data=0, and GBI=1, Then Send Current Data
If Cumulative Stress Data=0, and GBI>1, Then Update Cumulative Stress Data to Match GBI
Else Calculate GBI to Match Cumulative Stress Data
Control then continues to step S662.

In step S662, the updated cumulative stress counter information is sent to the stress data storage manager to be updated in one or more of the internal storage and external storage. More specifically, in step S632, the updated cumulative stress counter information is received. Next, in step S636, the external non-volatile storage is updated with the received updated cumulative stress counter information. In a similar manner, and in step S640, when the internal guard band index is not equal to the guard band index received from the stress data collector, the guard band index in the non-volatile internal storage is updated. Control then continues to step S644.

In step S644, a timer is reset pending the next event that requires the (re)valuation of whether a guard band index should be updated, control continues to step S648 where the control sequence ends.

Figure 7:
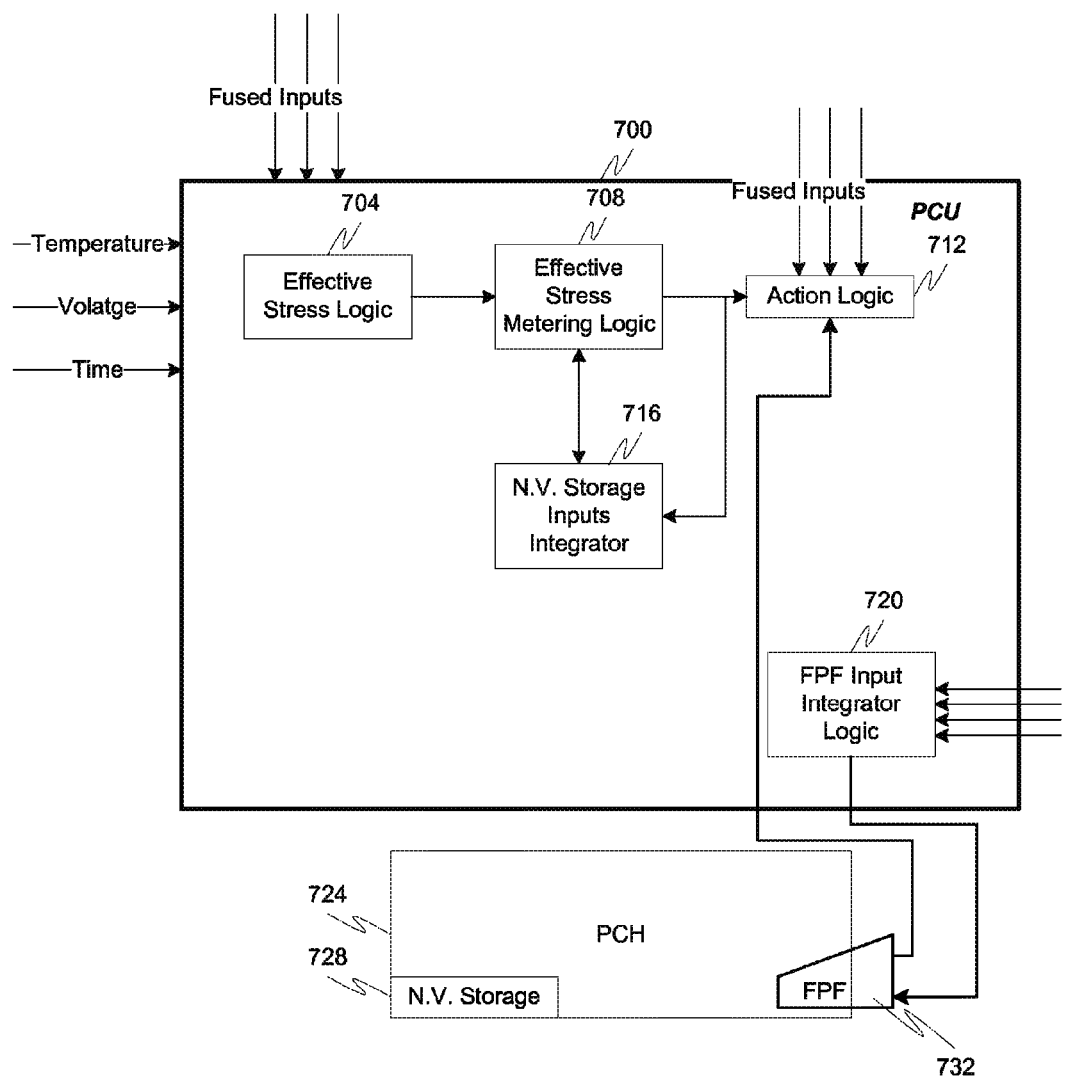
FIG. 7 illustrates another exemplary embodiment of an implementation of the guard band logic.

FIG. 7 illustrates another exemplary implementation for maintaining accurate guard information in a processor. Illustrative FIG. 7 includes logic within a power control unit 700. The PCU includes effective stress logic 704, effective stress metering logic 708, action logic 712, a non-volatile storage input integrator 716 and FPF input integrator logic 720. The PCU 700 is connectable to a PCH 724 which includes storage 728 and FPF 732. Operation of the PCU 700 and related components is similar to that described above with the effective stress logic 704 receives the stress information (e.g., temperature, voltage and time). The effective stress metering logic 708 manages the accumulated stress data, with the action logic 712 capable of forwarding and/or retrieving cumulative stress counter information from or with the cooperation of one or more of the storage inputs integrator 716, FPF 732 and storage 728.

Figure 8:
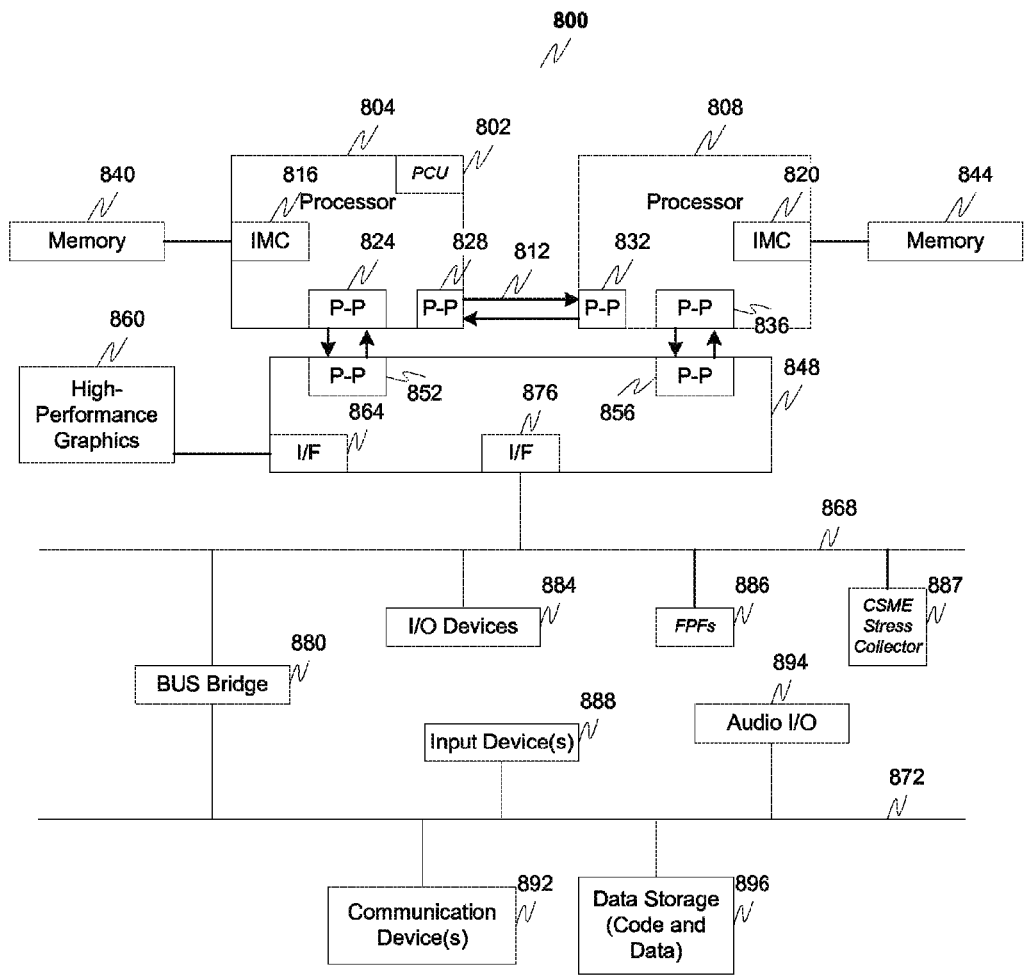
FIG. 8 illustrates another exemplary embodiment of an implementation of the guard band logic within a processor architecture.

Embodiments may be implemented in many different system types. Referring now to FIG. 8, a multiprocessor system 800 is shown in accordance with an implementation. As shown in FIG. 8, multiprocessor system 800 is a point-to-point interconnect system, and includes a first processor 804 and a second optional processor 808 coupled via a point-to-point interconnect 812. As shown in FIG. 8, each of processors 804 and 808 may be multicore processors, including first and second processor cores, although potentially many more cores may be present in the processors. The processors each may include hybrid write mode logics in accordance with an embodiment of the present disclosure. In some embodiments, the various components illustrated herein may be implemented the multiprocessor system 800. For example, the PCU 802, FPFs 886 and CSME stress collector 887, with the technology and logic described, herein can be included in the exemplary processor system 800.

While shown with two processors 804, 808, it is to be understood that the scope of the present disclosure is not so limited. In other implementations, one or more additional processors may be present in a given processor. Additionally, information indicative as to which processor the information in the FPFs is for can also be stored or otherwise associated with the guard band information.

Processors 804 and 808 are shown including integrated memory controller units 816 and 820, respectively. Processor 804 also includes as part of its bus controller units point-to-point (P-P) interfaces 824 and 828; similarly, the second processor 808 includes P-P interfaces 832 and 836. Processors 804, 808 may exchange information via a point-to-point (P-P) interface 812 using P-P interface circuits 828, 832. As shown in FIG. 8, IMCs 816 and 820 couple the processors to respective memories, namely a memory 840 and a memory 844, which may be portions of main memory locally attached to the respective processors.

Processors 804, 808 may each exchange information with a chipset 848 via individual P-P interfaces 852, 856 using point-to-point interface circuits 824, 852, 836, 856. Chipset 848 may also exchange information with a high-performance graphics circuit 860 via a high-performance graphics interface 864.

A shared cache (not shown) may optionally be included in either processor or outside of both processors, yet connected with the processors via, for example, the P-P interconnect, such that either or both processors' local cache information may be stored in the shared cache if a processor is placed into, for example, a low power mode.

Chipset 848 may be coupled to a first bus 868 via an interface 876. In one embodiment, first bus 868 may be a Peripheral Component Interconnect (PCI) bus, or a bus such as a PCI Express bus or another third generation or later I/O interconnect bus, although the scope of the present disclosure is not so limited.

As shown in FIG. 8, various I/O devices 884 may be coupled to the first bus 868, along with a bus bridge 880 which couples first bus 868 to a second bus 872. In one embodiment, the second bus 872 may be a low pin count (LPC) bus. Various devices may be coupled to second bus 872 including, for example, a keyboard and/or mouse or other input device 888, communication devices 892 and a storage unit 896 such as a disk drive or other mass storage device which may include instructions/code and data, in one embodiment. Further, an audio I/O 894 may be coupled to second bus 872. Note that other architectures are possible. For example, instead of the point-to-point architecture of FIG. 8, a system may implement a multi-drop bus or other such architecture.

Figure 9:
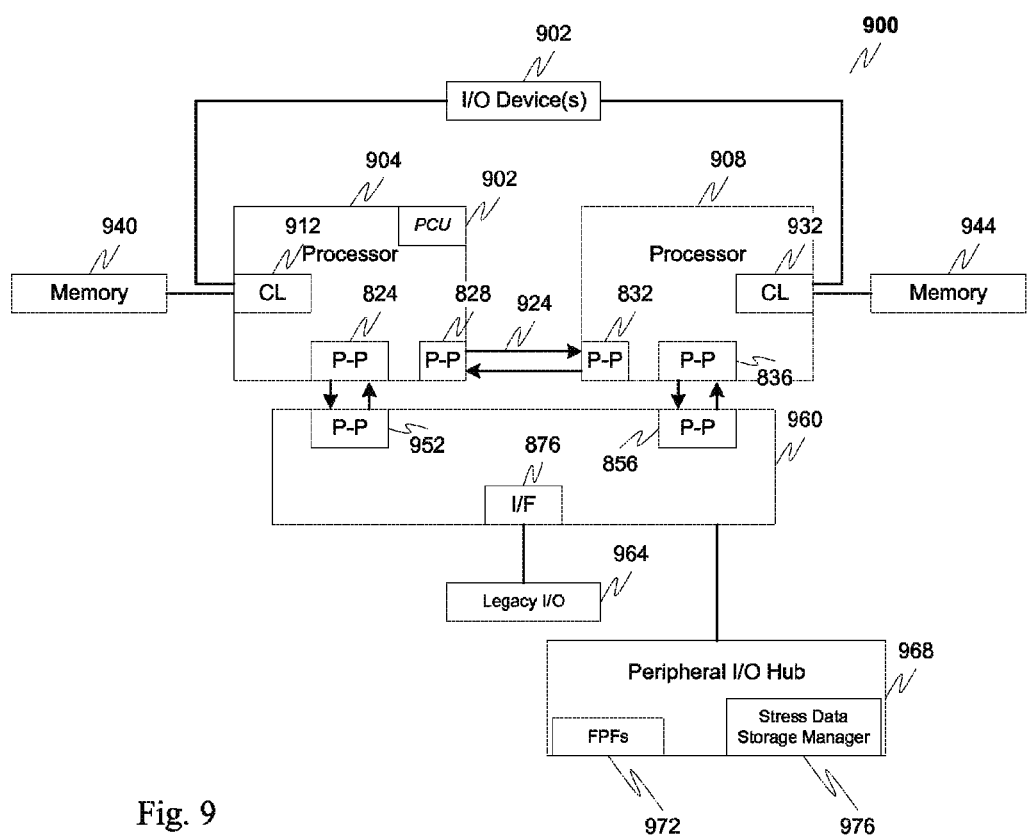
FIG. 9 illustrates another exemplary embodiment of an implementation of the guard band logic within a processor environment.

Referring now to FIG. 9, illustrated is a diagram of a third system 900 in accordance with an embodiment of the present disclosure. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 904, 908 (optional) may include integrated memory and I/O control logic ("CL") 912 and 932, respectively. For at least one embodiment, the CL 912, 932 may include integrated memory controller units such as described herein. In addition. CL 912, 932 may also include I/O control logic. FIG. 9 illustrates that the memories 940, 944 are coupled to the CL 912, 932, and that I/O devices 902 are also coupled to the control logic 912, 932. Legacy I/O devices 964 are coupled to the chipset 960.

In some embodiments, a PCU 902 (with the logic illustrated in FIG. 7) can be included in one or both processors 904, 908, and a peripheral I/O hub 968, with the FPFs 972 and stress data storage manager 976 are connected to the chipset 960.

Figure 10:
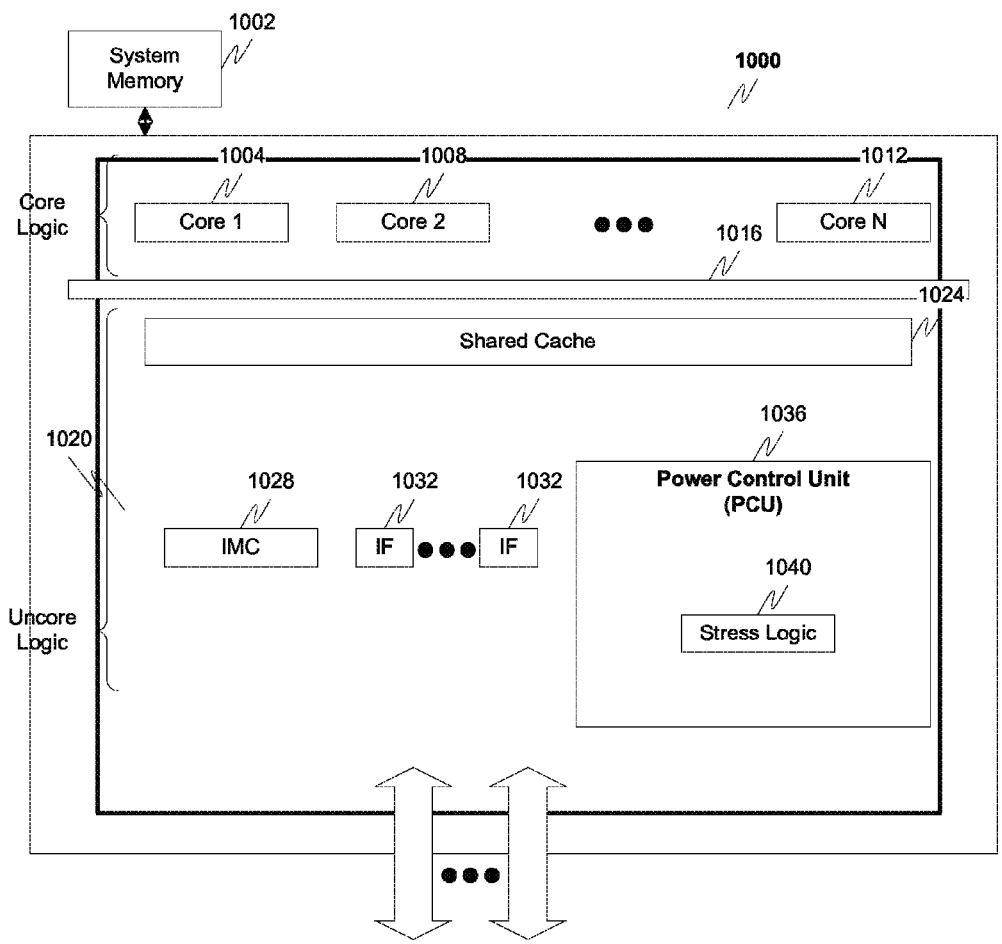
FIG. 10 illustrates another exemplary embodiment of an implementation of the guard band logic within a processor environment.

Referring now to FIG. 10, shown is a block diagram of an exemplary processor in accordance with an embodiment. As shown in FIG. 10, processor 1000 may be a multicore processor including a plurality of cores 1004-1012. In one embodiment, each such core may be configured to operate at multiple voltages and/or frequencies, and to enter turbo mode when available headroom exists (and assuming the processor has not aged to a point at which a turbo mode is no longer available). The various cores may be coupled via an interconnect/bus 1016 to a system agent or uncore 1020 that includes various components. As seen, the uncore 1020 may include a shared cache 1024 which may be a last level cache. In addition, the uncore may include an integrated memory controller 1028, various interfaces 1032 and a power control unit 1036.

In various embodiments, power control unit 1036 may include stress logic 1040, which may be a logic to implement the techniques outlined herein in FIGS. 4-6.

With further reference to FIG. 10, processor 1000 may communicate with a system memory 1002, e.g., via a memory bus. In addition, via interfaces 1032, connection can be made to various off-chip components such as peripheral devices, mass storage and so forth (not shown). While shown with this particular implementation in the embodiment of FIG. 10, the scope of the present disclosure is not limited in this regard.

Figure 11:
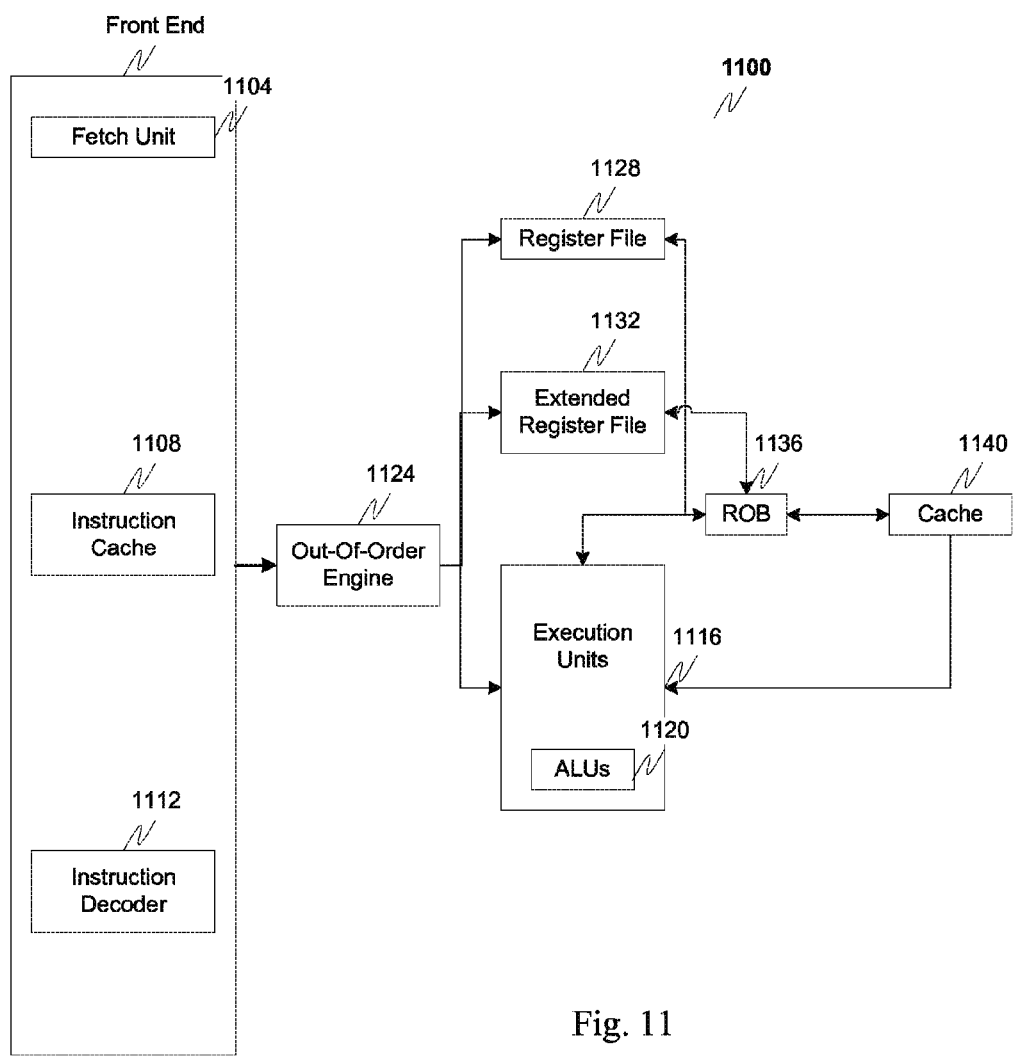
FIG. 11 illustrates another exemplary embodiment of an implementation of the guard band logic within a processor environment.

Referring now to FIG. 11, shown is a block diagram of a processor core in accordance with another embodiment. As shown in FIG. 11, processor core 1000 may be a multi-stage pipelined out-of-order processor. As shown in FIG. 11, core 1000 may operate at different voltages and frequencies (both in and out of turbo mode).

As seen in FIG. 11, core 1100 includes a front end, which may be used to fetch instructions to be executed and prepare them for use later in the processor. For example, the front end may include a fetch unit 1104, an instruction cache 1108, and an instruction decoder 1112 and other well known componentry. In some implementations, the front end may further include a trace cache, along with microcode storage as well as a micro-operation storage. Fetch unit 1104 may fetch macro-instructions, e.g., from memory or instruction cache 1108, and feed them to instruction decoder 112 to decode them into primitives, i.e., micro-operations for execution by the processor.

Coupled between the front end and execution units 1116 is an out-of-order (OOO) engine 1124 that may be used to receive the micro-instructions and prepare them for execution. More specifically OOO engine 1124 may include various buffers to re-order micro-instruction flow and allocate various resources needed for execution, as well as to provide renaming of logical registers onto storage locations within various register files such as register file 1128 and extended register file 1132. Register file 1128 may include separate register files for integer and floating point operations. Extended register file 1132 may provide storage for vector-sized units, e.g., 256 or 512 bits per register.

Various resources may be present in execution units 1116, including, for example, various integer, floating point, and single instruction multiple data (SIMD) logic units, among other specialized hardware. For example, such execution units may include one or more arithmetic logic units (ALUs) 1120, among other such execution units.

Results from the execution units may be provided to retirement logic, namely a reorder buffer (ROB) 1136. More specifically, ROB 1136 may include various arrays and logic to receive information associated with instructions that are executed. This information is then examined by ROB 1136 to determine whether the instructions can be validly retired and result data committed to the architectural state of the processor, or whether one or more exceptions occurred that prevent a proper retirement of the instructions. ROB 1136 may also handle other operations associated with retirement.

As shown in FIG. 11 ROB 1136 is coupled to a cache 1140 which, in one embodiment may be a low level cache (e.g., an L1 cache) although the scope of the present disclosure is not limited in this regard. Also, execution units 1116 can be directly coupled to cache 1140. From cache 1140, data communication may occur with higher level caches, system memory and so forth. While shown with this high level in the embodiment of FIG. 11, it is to be understood the scope of the present disclosure is not limited in this regard. For example, while the implementation of FIG. 11 is with regard to an out-of-order machine such as of a so-called x86 instruction set architecture (ISA), the scope of the present disclosure is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

In various embodiments, the specific systems of the present disclosure can be included in the architecture shown in FIG. 11, such as the stress data collector, stress data storage manager and FPFs, which can implement the techniques outlined herein in FIGS. 4-6.

Exemplary aspects are directed toward:

A processor circuit comprising:
stress data collector logic that collects stress data information usable to set a guard band index for a processor; and
a plurality of in-field programmable fuses that store guard band index information for the processor.

Any one or more above aspects, further comprising stress data storage manager logic adapted to store one or more of guard band index information and stress information in one or more of the plurality of in-field programmable fuses.

Any one or more above aspects, further comprising stress data storage manager adapted to store one or more of guard band index information and stress information in external storage.

Any one or more above aspects, further comprising stress data storage manager logic this is adapted to, upon boot of the processor, read stress data information from one or more of the plurality of in-field programmable fuses and an external storage and forward this information to the stress data collector logic.

Any one or more above aspects, wherein the stress data collector logic compares the stress data information from one or more of the plurality of in-field programmable fuses and the stress data from an external storage and, when there is a discrepancy, selects the stress data from the plurality of in-field programmable fuses to set the guard band for the processor.

Any one or more above aspects, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

Any one or more above aspects, wherein the stress data is cumulative stress data.

Any one or more above aspects, wherein the stress data collector is within a north complex and the plurality of in-field programmable fuses is in a south complex.

Any one or more above aspects, wherein when the stress data collector logic detects a triggering event, the guard band index is read from the plurality of in-field programmable fuses and used for the guard band index of the processor.

A method comprising:
collecting stress data information usable to set a guard band index for a processor; and
storing, in a plurality of in-field programmable fuses, guard band index information for the processor.

Any one or more above aspects, further comprising storing one or more of guard band index information and stress information in one or more of the plurality of in-field programmable fuses.

Any one or more above aspects, further comprising storing one or more of guard band index information and stress information in external storage.

Any one or more above aspects, further comprising reading, upon boot of the processor, stress data information from one or more of the plurality of in-field programmable fuses and an external storage and forwarding this information to the stress data collector.

Any one or more above aspects, further comprising comparing the stress data information from one or more of the plurality of in-field programmable fuses and the stress data from an external storage, and when there is a discrepancy, selecting the stress data from the plurality of in-field programmable fuses to set the guard band for the processor.

Any one or more above aspects, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

Any one or more above aspects, wherein the stress data is cumulative stress data.

Any one or more above aspects, wherein the collecting step is performed within a north complex and the plurality of in-field programmable fuses are in a south complex.

Any one or more above aspects, further comprising:
detecting a triggering event;
reading the guard band index from the plurality of in-field programmable fuses; and
using for the guard band index for the processor.

A processor comprising:
means for collecting stress data information usable to set a guard band index for a processor; and
means for storing, in a plurality of in-field programmable fuses, guard band index information for the processor.

Any one or more above aspects, further comprising means for storing one or more of guard band index information and stress information in one or more of the plurality of in-field programmable fuses.

Any one or more above aspects, further comprising means for storing one or more of guard band index information and stress information in external storage.

Any one or more above aspects, further comprising means for reading, upon boot of the processor, stress data information from one or more of the plurality of in-field programmable fuses and an external storage and forwarding this information to the stress data collector.

Any one or more above aspects, further comprising means for comparing the stress data information from one or more of the plurality of in-field programmable fuses and the stress data from an external storage, and when there is a discrepancy, selecting the stress data from the plurality of in-field programmable fuses to set the guard band for the processor.

Any one or more above aspects, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

Any one or more above aspects, wherein the stress data is cumulative stress data.

Any one or more above aspects, wherein the means for collecting is within a north complex and the plurality of in-field programmable fuses are in a south complex.

Any one or more above aspects, further comprising:
means for detecting a triggering event;
means for reading the guard band index from the plurality of in-field programmable fuses; and means for using for the guard band index for the processor.

A non-transitory computer readable information storage media having stored thereon instructions, that when executed by one or more processors cause to be performed a method comprising:
collecting stress data information usable to set a guard band index for a processor; and
storing, in a plurality of in-field programmable fuses, guard band index information for the processor.

Any one or more above aspects, further comprising storing one or more of guard band index information and stress information in one or more of the plurality of in-field programmable fuses.

Any one or more above aspects, further comprising storing one or more of guard band index information and stress information in external storage.

Any one or more above aspects, further comprising reading, upon boot of the processor, stress data information from one or more of the plurality of in-field programmable fuses and an external storage and forwarding this information to the stress data collector.

Any one or more above aspects, further comprising comparing the stress data information from one or more of the plurality of in-field programmable fuses and the stress data from an external storage, and when there is a discrepancy, selecting the stress data from the plurality of in-field programmable fuses to set the guard band for the processor.

Any one or more above aspects, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

Any one or more above aspects, wherein the stress data is cumulative stress data.

Any one or more above aspects, wherein the collecting step is performed within a north complex and the plurality of in-field programmable fuses are in a south complex.

Any one or more above aspects, further comprising:
detecting a triggering event;
reading the guard band index from the plurality of in-field programmable fuses; and
using for the guard band index for the processor.

For purposes of explanation, numerous details are set forth in order to provide a thorough understanding of the present embodiments. It should be appreciated however that the techniques herein may be practiced in a variety of ways beyond the specific details set forth herein.

Furthermore, while the exemplary embodiments illustrated herein show the various components of the system collocated, it is to be appreciated that the various components of the system can be located at distant portions of a system and/or on the die.

The term module as used herein can refer to any known or later developed hardware, software, firmware, or combination thereof that is capable of performing the functionality associated with that element. The terms determine, calculate and compute, and variations thereof, as used herein are used interchangeably and include any type of methodology, process, mathematical operation or technique.

While the above-described flowcharts have been discussed in relation to a particular sequence of events, it should be appreciated that changes to this sequence can occur without materially effecting the operation of the embodiment(s). Additionally, the exemplary techniques illustrated herein are not limited to the specifically illustrated embodiments but can also be utilized with the other exemplary embodiments and each described feature is individually and separately claimable.

Additionally, the systems, methods and techniques can be implemented on one or more of a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device such as PLD, PLA, FPGA, PAL, any comparable means, or the like. In general, any device capable of implementing a state machine that is in turn capable of implementing the methodology illustrated herein can be used to implement the various protocols and techniques according to the disclosure provided herein.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, Broadcom® AirForce BCM4704/BCM4703 wireless networking processors, the AR7100 Wireless Network Processing Unit, other industry-equivalent processors, and may perform computational functions using any known or future-developed standard, instruction set, libraries, and/or architecture.

Furthermore, the disclosed methods may be readily implemented in software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with the embodiments is dependent on the speed and/or efficiency requirements of the system, the particular function, and the particular software or hardware systems or microprocessor or microcomputer systems being utilized.

Moreover, the disclosed methods may be readily implemented in software and/or firmware that can be stored on a storage medium, executed on programmed general-purpose computer with the cooperation of a controller and memory, a special purpose computer, a microprocessor, or the like. In these instances, the systems and methods can be implemented as program embedded on personal computer such as an applet, JAVA® or CGI script, as a resource residing on a server or computer workstation, as a routine embedded in a dedicated system or system component, or the like. The system can also be implemented by physically incorporating the system and/or method into a software and/or hardware system, such as the hardware and software systems of a processor.

In the description and claims, the terms "coupled" and/or "connected," along with their derivatives, may have be used.

These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, but yet still co-operate or interact with each other. For example, an execution unit may be coupled with a register and/or a decode unit through one or more intervening components. In the figures arrows are used to show connections and couplings.

The term "and/or" may have been used. As used herein, the term "and/or" means one or the other or both (e.g., A and/or B means A or B or both A and B).

In the description herein, specific details have been set forth in order to provide a thorough understanding of the embodiments. However, other embodiments may be practiced without some of these specific details. The scope of the embodiments is not to be determined by the specific examples provided above, but only by the claims below. In other instances, well-known circuits, structures, devices, and operations have been shown in block diagram form and/or without detail and/or omitted in order to avoid obscuring the understanding of the description. Where considered appropriate, reference numerals, or terminal portions of reference numerals, have been repeated among the figures to indicate corresponding or analogous elements, which may optionally have similar or the same characteristics, unless specified or otherwise clearly apparent.

Certain operations may be performed by hardware components, or may be embodied in machine-executable or circuit-executable instructions, that may be used to cause and/or result in a machine, circuit, or hardware component (e.g., a processor(s), core(s), portion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operable to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operable to cause the machine to perform and/or result in the machine performing one or operations, methods, or techniques disclosed herein. The machine-readable medium may store or otherwise provide one or more of the embodiments of the instructions disclosed herein.

In some embodiments, the machine-readable medium may include a tangible and/or non-transitory machine-readable storage medium. For example, the tangible and/or non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like.

Examples of suitable machines include, but are not limited to, a general-purpose processor, a special-purpose processor, an instruction processing apparatus, a digital logic circuit, an integrated circuit, or the like. Still other examples of suitable machines include a computing device or other electronic device that includes a processor, instruction processing apparatus, digital logic circuit, or integrated circuit. Examples of such computing devices and electronic devices include, but are not limited to, desktop computers, laptop computers, notebook computers, tablet computers, netbooks, smartphones, cellular phones, servers, network devices (e.g., routers), Mobile Internet devices (MIDs), media players, smart televisions, nettops, miniature PC, set-top boxes, and video game controllers.

Reference throughout this specification to "one embodiment," "an embodiment," "one or more embodiments," "some embodiments," for example, indicates that a particular feature may be included in the practice of the technique but is not necessarily required to be. Similarly, in the description, various features are sometimes grouped together in a single embodiment, Figure, or description thereof for the purpose of streamlining the disclosure and aiding in the understanding of various inventive aspects. This method of disclosure, however, is not to be interpreted as reflecting an intention that the techniques herein require more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment.

Although embodiments described herein are describe in relation to processors, such as multicore processors including multiple cores, system agent circuitry, cache memories, and one or more other processing units, understand the scope of the present disclosure is not limited in this regard and embodiments are applicable to other semiconductor devices such as chipsets, graphics chips, memories and so forth. Also, although embodiments described herein are with regard to hardware prefetching, in accordance with an embodiment the system can be used to access data in other devices as well.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the disclosed techniques may be described with respect to a limited number of embodiments, those skilled in the art will appreciate numerous modifications and variations therefrom. It is intended that the appended claims cover all such modifications and variations that fall within the spirit and scope of the present disclosure.

In the detailed description, numerous specific details are set forth in order to provide a thorough understanding of the disclosed techniques. However, it will be understood by those skilled in the art that the present techniques may be practiced without these specific details. In other instances, well-known methods, procedures, components and circuits have not been described in detail so as not to obscure the present disclosure.

Although embodiments are not limited in this regard, discussions utilizing terms such as, for example, "processing," "computing," "calculating," "determining," "establishing", "analysing", "checking", or the like, may refer to operation(s) and/or process(es) of a computer, a computing platform, a computing system, a communication system or subsystem, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments are not limited in this regard, the terms "plurality" and "a plurality" as used herein may include, for example, "multiple" or "two or more." The terms "plurality" or "a plurality" may be used throughout the specification to describe two or more components, devices, elements, units, parameters, circuits, or the like. For example, "a plurality of processors" may include two or more processors.

The terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, interconnected with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, circuitry, firmware or software, or some combination of at least two of the same. It should be noted that the functionality associated with any particular controller may be centralized or distributed, whether locally or remotely. Definitions for certain words and phrases are provided throughout this document and those of ordinary skill in the art should understand that in many, if not most instances, such definitions apply to prior, as well as future uses of such defined words and phrases.

It is therefore apparent that there has been provided systems and methods for maintaining guard band information. While the embodiments have been described in conjunction with a number of embodiments, it is evident that many alternatives, modifications and variations would be or are apparent to those of ordinary skill in the applicable arts. Accordingly, this disclosure is intended to embrace all such alternatives, modifications, equivalents and variations that are within the spirit and scope of this disclosure.

The invention claimed is:

1. A processor circuit comprising:
   stress data collector logic adapted to collect for the processor circuit: stress data information and roll-back or re-provision information usable to set a guard band index for the processor circuit, the roll-back or re-provision information indicating a miss-match between an in-use guard band index and information received from stress data storage manager logic; and
   a plurality of in-field programmable fuses adapted to store guard band index information for the processor circuit.

2. The processor circuit of claim 1, wherein the stress data storage manager logic is adapted to store one or more of guard band index information and stress information in one or more of the plurality of in-field programmable fuses.

3. The processor circuit of claim 1, further comprising stress data storage manager adapted to store one or more of guard band index information and stress information in external storage.

4. The processor circuit of claim 1, wherein the stress data storage manager logic is adapted to, upon boot of the processor, read stress data information from one or more of the plurality of in-field programmable fuses and an external storage and forward this information to the stress data collector logic.

5. The processor circuit of claim 1, wherein the stress data collector logic is adapted to compare the stress data information from one or more of the plurality of in-field programmable fuses and the stress data from an external storage and, when there is a discrepancy, select the stress data from the plurality of in-field programmable fuses to set the guard band for the processor.

6. The processor circuit of claim 1, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

7. The processor circuit of claim 1, wherein the stress data is cumulative stress data.

8. The processor circuit of claim 1, wherein the stress data collector is within a north complex and the plurality of in-field programmable fuses is in a south complex.

9. The processor circuit of claim 1, wherein when the stress data collector logic detects a triggering event, the guard band index is read from the plurality of in-field programmable fuses and used for the guard band index of the processor.

10. A method comprising:
    collecting stress data information and roll-back or re-provision information for a processor circuit usable to set a guard band index for the processor circuit, the roll-back or re-provision information indicating a miss-match between an in-use guard band index and information received from stress data storage manager logic; and
    storing, in a plurality of in-field programmable fuses, guard band index information for the processor circuit.

11. The method of claim 10, further comprising storing one or more of guard band index information and stress information in one or more of the plurality of in-field programmable fuses.

12. The method of claim 10, further comprising storing one or more of guard band index information and stress information in external storage.

13. The method of claim 10, further comprising reading, upon boot of the processor, stress data information from one or more of the plurality of in-field programmable fuses and an external storage and forwarding this information to the stress data collector.

14. The method of claim 10, further comprising comparing the stress data information from one or more of the plurality of in-field programmable fuses and the stress data from an external storage, and when there is a discrepancy, selecting the stress data from the plurality of in-field programmable fuses to set the guard band for the processor.

15. The method of claim 10, wherein guard band index is synced to the stress data based on the following conditions: when the stress data=0, and the guard band index=1, then the stress data is used to set the guard band index, when the stress data=0, and the guard band index>1, then the stress data is updated to match the guard band index, otherwise, the guard band index is updated to match the stress data.

16. The method of claim 10, wherein the stress data is cumulative stress data.

17. The method of claim 10, wherein the collecting step is performed within a north complex and the plurality of in-field programmable fuses are in a south complex.

18. The method of claim 10, further comprising:
detecting a triggering event;
reading the guard band index from the plurality of in-field programmable fuses; and
using for the guard band index for the processor.

19. A processor comprising:
means for collecting stress data information and roll-back or re-provision information for the processor usable to set a guard band index for the processor, the roll-back or re-provision information indicating a miss-match between an in-use guard band index and information received from stress data storage manager logic; and
means for storing, in a plurality of in-field programmable fuses, guard band index information for the processor.

20. The processor of claim 19, further comprising means for storing one or more of guard band index information and stress information in one or more of the plurality of in-field programmable fuses.

* * * * *

UNITED STATES PATENT AND TRADEMARK OFFICE
CERTIFICATE OF CORRECTION

PATENT NO. : 9,704,598 B2
APPLICATION NO. : 14/583608
DATED : July 11, 2017
INVENTOR(S) : Vinupama Godavarthi et al.

Page 1 of 1

It is certified that error appears in the above-identified patent and that said Letters Patent is hereby corrected as shown below:

In the Specification

- At Column 2, Line 56, delete "NO" and insert -- ($S_{eff}$) --, therefore.

Signed and Sealed this
Eighth Day of May, 2018

Andrei Iancu
*Director of the United States Patent and Trademark Office*